(12) United States Patent
Furuta

(10) Patent No.: US 7,897,999 B2
(45) Date of Patent: Mar. 1, 2011

(54) SEMICONDUCTOR INTEGRATED CIRCUIT DEVICE

(75) Inventor: Hiroshi Furuta, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 476 days.

(21) Appl. No.: 11/987,854

(22) Filed: Dec. 5, 2007

(65) Prior Publication Data

US 2008/0135978 A1 Jun. 12, 2008

(30) Foreign Application Priority Data

Dec. 8, 2006 (JP) ................................ 2006-331618

(51) Int. Cl.
*H01L 29/66* (2006.01)

(52) U.S. Cl. ......... 257/173; 257/355; 257/356; 257/360; 257/288; 257/532; 257/E27.11; 257/E29.345

(58) Field of Classification Search ................ None
See application file for complete search history.

(56) References Cited

U.S. PATENT DOCUMENTS

| | | | |
|---|---|---|---|
| 5,801,412 A * | 9/1998 | Tobita ............................ | 257/296 |
| 6,340,832 B2 | 1/2002 | Kasahara | |
| 6,943,412 B1 | 9/2005 | Horiguchi | |
| 7,222,320 B2 | 5/2007 | Ogawa | |
| 2001/0050409 A1 | 12/2001 | Kasahara | |
| 2002/0063298 A1 * | 5/2002 | Wang ............................. | 257/379 |
| 2002/0153551 A1 * | 10/2002 | Wong et al. .................... | 257/303 |
| 2005/0012159 A1 * | 1/2005 | Sekimoto ....................... | 257/379 |
| 2006/0017135 A1 | 1/2006 | Ogawa | |
| 2006/0092675 A1 | 5/2006 | Kajita | |
| 2006/0138591 A1 * | 6/2006 | Amey et al. ................... | 257/532 |

FOREIGN PATENT DOCUMENTS

| | | |
|---|---|---|
| JP | 2001-060663 A | 3/2001 |
| JP | 2001-284526 A | 10/2001 |
| JP | 2003-086699 A | 3/2003 |
| JP | 2006-040962 A | 2/2006 |
| JP | 2006-101254 A | 4/2006 |

OTHER PUBLICATIONS

Boylestad, Robert L. Introductory Circuit Analysis 3RD Edition. Ohio: Charles E. Merrill Publishing Company, 1977.*
T. Suzuki et al., "A Study of Power-Clamp ESD Protection Circuit," EOS Symposium, 15th RCJ Reliability Symposium Happyo Ronbunsyu, pp. 185-190.

* cited by examiner

*Primary Examiner* — Sue Purvis
*Assistant Examiner* — Fei Fei Yeung Lopez
(74) *Attorney, Agent, or Firm* — Foley & Lardner LLP

(57) ABSTRACT

A semiconductor integrated circuit device includes a power supply line connected to a power supply terminal, a ground line connected to a ground terminal and a plurality of capacitors connected in parallel between the power supply line and the ground line. The plurality of capacitors include a first capacitor arranged at a first distance from one of the terminals and a second capacitor arranged at a second distance which is larger than the first distance from the one of the terminals, and the first capacitor has a larger area than the second capacitor.

18 Claims, 7 Drawing Sheets

SEMICONDUCTOR INTEGRATED CIRCUIT DEVICE

BACKGROUND OF THE INVENTION

1. Field of the Invention

The present invention relates to a semiconductor integrated circuit device, and particularly to a semiconductor integrated circuit device having a decoupling capacitor (on chip capacitor).

2. Description of Related Art

With increasing number of devices and higher speed of LSI (Large Scale Integration), the problem of power supply noise is becoming serious. As a countermeasure against this power supply noise, the method of connecting a power source line and a ground line by a decoupling capacitor is known. The decoupling capacitor is required to follow various noises with different frequencies.

Meanwhile, the decoupling capacitor is playing an important role as an ESD (Electrostatic Discharge) protection device. In recent years, the countermeasure against ESD for the decoupling capacitor itself is posing a serious problem due to a thinner gate insulating film. Therefore, a decoupling capacitor which satisfies both aspects of the countermeasure for noise and ESD is needed.

The techniques of reducing the power supply noise using conventional decoupling capacitors are explained here. Japanese Unexamined Patent Application Publication No. 2006-101254 (Kajita) discloses the technique to form a resonant circuit and a low pass filter using a decoupling capacitor so as to attempt reducing the noise of various frequencies. In the technique disclosed by Kajita, a power source line is resonated compulsorily by the resonant circuit formed of a decoupling capacitor and coil to concentrate noise near resonance frequency. Then, the noise concentrated near the resonance frequency is attenuated by the low pass filter formed of resistance and a capacitor.

Generally, a decoupling capacitor is disposed to a "vacant area" where no other devices are not disposed, after disposing a circuit block. A change in the circuit size and capacity to mount may cause insufficient noise reduction effect by the decoupling capacitor. Therefore, Japanese Unexamined Patent Application Publication No. 2006-040962 (Ogawa) discloses the method of disposing a decoupling capacitor in the chip. Specifically, the method is to secure a decoupling capacitor necessary for each unit area and efficiently carry out the disposing work. Moreover, Japanese Unexamined Patent Application Publication No. 2001-284526 (Kasahara) discloses the technique to improve the frequency characteristic of MIM capacitance. Generally, the frequency characteristics are known to be influenced by the shape of a capacitor.

Next, the role of a decoupling capacitor as an ESD protection device is described. FIG. 6 shows the configuration of a semiconductor integrated circuit device using a conventional decoupling capacitor. As shown in FIG. 6, a plurality of decoupling capacitors C, which are MOS capacitances, are provided between a power source line connected to a power supply terminal Vcc and a ground line connected to a ground terminal GND. Note that in FIG. 6, the plurality of decoupling capacitors are expressed as one decoupling capacitor.

Moreover, an ESD protection device (power supply protection device) is provided between the power source line and the ground line and an ESD protection device (input protection device) is provided between an input terminal IN and the ground line. Here, a case is explained in which electrostatic surge is applied between the power supply terminal Vcc and the ground terminal GND as an example. Although electrostatic surge is discharged through a power supply protection device, it is also charged to a decoupling capacitor immediately after the electrostatic surge is applied so as to prevent an excessive current from flowing into the power supply protection device.

Moreover, a case is explained in which electrostatic surge is applied between the power supply terminal Vcc and the input terminal as another example. The discharge path in this case is; power supply terminal Vcc <=> power supply protection device/decoupling capacitor <=> ground line <=> input protection device <=> input terminal IN. Although whether the electrostatic surge passes through the decoupling capacitor C, the power supply protection device or both of them at the same time depends on the layout, the decoupling capacitor C may be a discharge path.

In "DENGEN KURANPU NI KANSURU KOSATU" by Suzuki et al., November 2005, EOS/ESD/EMC Symposium, 15th RCJ Reliability Symposium Happyo Ronbunsyu, pp.185-190, the relationship between a capacitance value of a decoupling capacitor and ESD robustness is shown when the decoupling capacitor and a protection device (power supply protection device) exist between a power supply terminal and a ground terminal. The technique disclosed by Suzuki et al. indicates that when static electricity is applied between power supply and ground, as the decoupling capacitor does not contribute to electrostatic discharge (ESD) if the capacitance value of the decoupling capacitor is about 1 pF, ESD robustness is determined by the power supply protection device. Moreover, Suzuki et al. indicate that if the capacitance value of the decoupling capacitor is large, about 40 nF, static charge is discharged through the decoupling capacitor. The Suzuki et al. further indicate that if the capacitance value of the decoupling is about 100 pF, which is between 1 pF and 40 nF, the tolerated dose of the power supply protection device decreases under the influence of the operation of the decoupling capacitor.

Moreover, although not shown in FIG. 6, the decoupling capacitor may also be a discharge path at the time of a CDM (Charged device model) test. When considering CDM discharge which is discharged from the power supply terminal Vcc when a semiconductor device of P type substrate is charging, charge by the side of a ground line potential (substrate potential) is discharged through the power supply protection device and a decoupling capacitor.

Japanese Unexamined Patent Application Publication No. 2001-060663 (Horiguchi) discloses the necessity for the ESD protection of MOS capacitance and the configuration of a protection device. Horiguchi indicates that when there is a large potential difference between two electrodes of a MOS capacitance device at the time of a CDM test, protection devices must be provided to appropriate places in order to protect the capacitance device. Moreover, Japanese Unexamined Patent Application Publication No. 2003-86699 (Takamiya) illustrates an example of a ESD countermeasure for a decoupling capacitor itself.

By increasing number of devices and higher speed of LSI, diversification of power supply noise and high frequency noise in each functional block inside a chip are becoming a problem. It is necessary to take frequency characteristics into consideration like Kajita as the countermeasure for these problems. However, as generated noises are different for each circuit, it cannot be supported by one resonant circuit and a filter circuit. Moreover, Ogawa does not support the types of noises (frequency characteristics of a capacitor). Furthermore, although Kasahara takes the frequency characteristics into consideration, Kasahara does not have any suggestion concerning the arrangement of a decoupling capacitor in a chip.

In addition, as indicated by Suzuki et al., since the capacitance value of a decoupling capacitor influences ESD robustness, it must be designed together with ESD robustness of the protection device itself. However, such consideration has not been made for the arrangement of conventional decoupling capacitors.

Furthermore, by a thinner insulating film of a decoupling capacitor (gate insulating film in case of a MOS capacitance), ESD robustness of the decoupling capacitor itself has become a problem. Horiguchi and Takamiya indicate the necessity for protection of a MOS capacitance device. However, both ESD robustness of a decoupling capacitor and noise reduction have not simultaneously been taken into consideration. Especially for a LSI having many power supply and ground terminals, there are various capacitance values of decoupling capacitors between power supply and ground. Therefore, the inventor has now discovered that a configuration which simultaneously satisfies three requirements of noise countermeasure, ESD robustness and ESD protection of a decoupling capacitor itself has not been realized.

SUMMARY

In one embodiment, a semiconductor integrated circuit device includes a power supply line connected to a power supply terminal, a ground line connected to a ground terminal and a plurality of capacitors connected in parallel between the power supply line and the ground line. The plurality of capacitors include a first capacitor arranged at a first distance from one of the terminals and a second capacitor arranged at a second distance which is larger than the first distance from the one of the terminals, and the first capacitor has a larger area than the second capacitor. By having a large-shaped capacitance device near external terminals where more current flows, it is possible to improve ESD robustness of the capacitor itself. Furthermore, mounting a plurality of capacitors in different shapes enables to correspond to noise of various frequencies.

The present invention is able to provide a semiconductor integrated circuit device having a decoupling capacitor capable of achieving both the noise countermeasure of a circuit and ESD protection.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 7:
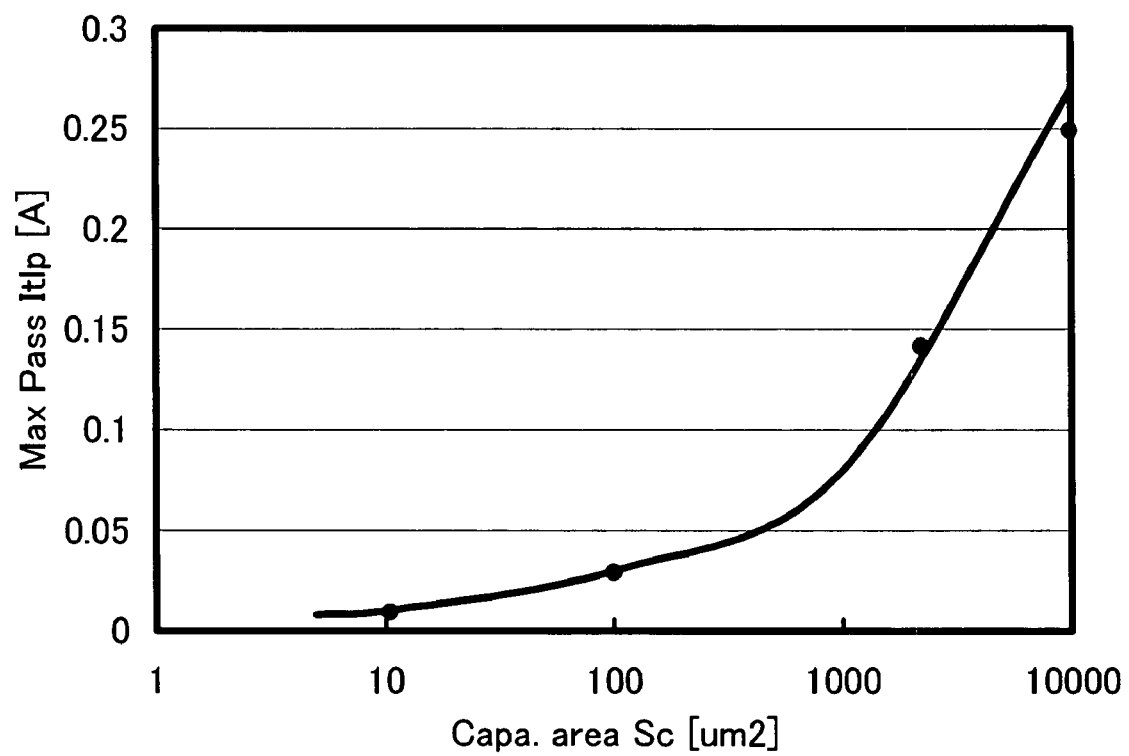
FIG. 7 is a graph showing a relationship between a MOS capacitance device and ESD robustness.

For the present invention, the inventor firstly investigated the relationship between MOS capacitance and ESD robustness. Then, the inventor has made the present invention based on the result. Therefore, firstly the relationship between the MOS capacitance and the ESD robustness is described, which is a problem to be solved by the present invention. FIG. 7 shows the relationship between a capacitance device (MOS capacitance device) and ESD robustness (TLP (Transmission Line Pulsing) tolerated dose) is shown in FIG. 7. In addition, those skilled in the art recognize that the TLP current value and the ESD robustness are in proportionality relation.

Here, a MOS capacitance device having a gate oxide film of 5 nm thickness is manufactured as a capacitance device. In FIG. 7, the horizontal axis indicates the area (gate area) Sc of the MOS capacitance device by the logarithmic axis. Moreover, the vertical axis indicates the TLP current ITLP by the linear axis. FIG. 7 indicates the following relationship.

$$\text{ITLP} \propto a * Sc^b \text{ (a and b are constants)} \quad (1)$$

Therefore, when ESD robustness is taken into consideration, it can be seen that the area of a MOS capacitance device must be given attention. That is, since a MOS capacitance device with a small area has low ESD robustness, a measure to protect the MOS capacitance device itself by a protection device or increase the area of the MOS capacitance device is required.

In the present invention, the shape of the MOS capacitance device disposed near an external terminal (a power supply terminal and a ground terminal) is enlarged. In addition, if a plurality of capacitance devices are formed to increase the total capacitance without considering the shape of a MOS capacitance device, it can be thought that the area of the MOS capacitance device will become large and area dependency as in the formula (1) will not be a problem. However, the above-mentioned problem cannot be solved in this way. Thus, it is not a problem if current flows equally to each MOS capacitance device, however in reality, current flowing nearby and far from the external terminal is different and more current flows to a capacitance device near the external terminal. Therefore, the MOS capacitance device disposed near the external terminal is easy to be destroyed. Therefore, as in the present invention, the shape of the MOS capacitance device disposed near the external terminal (the power supply terminal and the ground terminal) is enlarged and the ESD robustness of the MOS capacitance device itself is improved.

Next, a solution for the problem of the power supply noise in the present invention is described. Here, a MOS capacitance device is described having MOSFET structure in which a source, a drain and a substrate potential are made to be the same potential and a gate electrode as an opposite electrode. As disclosed in Japanese Unexamined Patent Application Publication No. 2001-284526, the relationship between the area of the MOS capacitance device and frequency has higher frequency response as the gate area is smaller (gate length is shorter). Therefore, in the present invention, in order to correspond to the noise of various frequencies, a plurality of capacitance devices are mounted so that the capacitance device in various shapes have necessary capacitance values according to the noise.

Specifically, a power supply line and a ground line are respectively divided into a trunk line and a branch line, and a large MOS capacitance device (large capacity in general) is connected to the trunk line and a small MOS capacitance device (small capacity in general) is connected to the branch line. Hereafter, embodiments of the invention are described in detail with reference to the drawings.

First Embodiment

Figure 1:
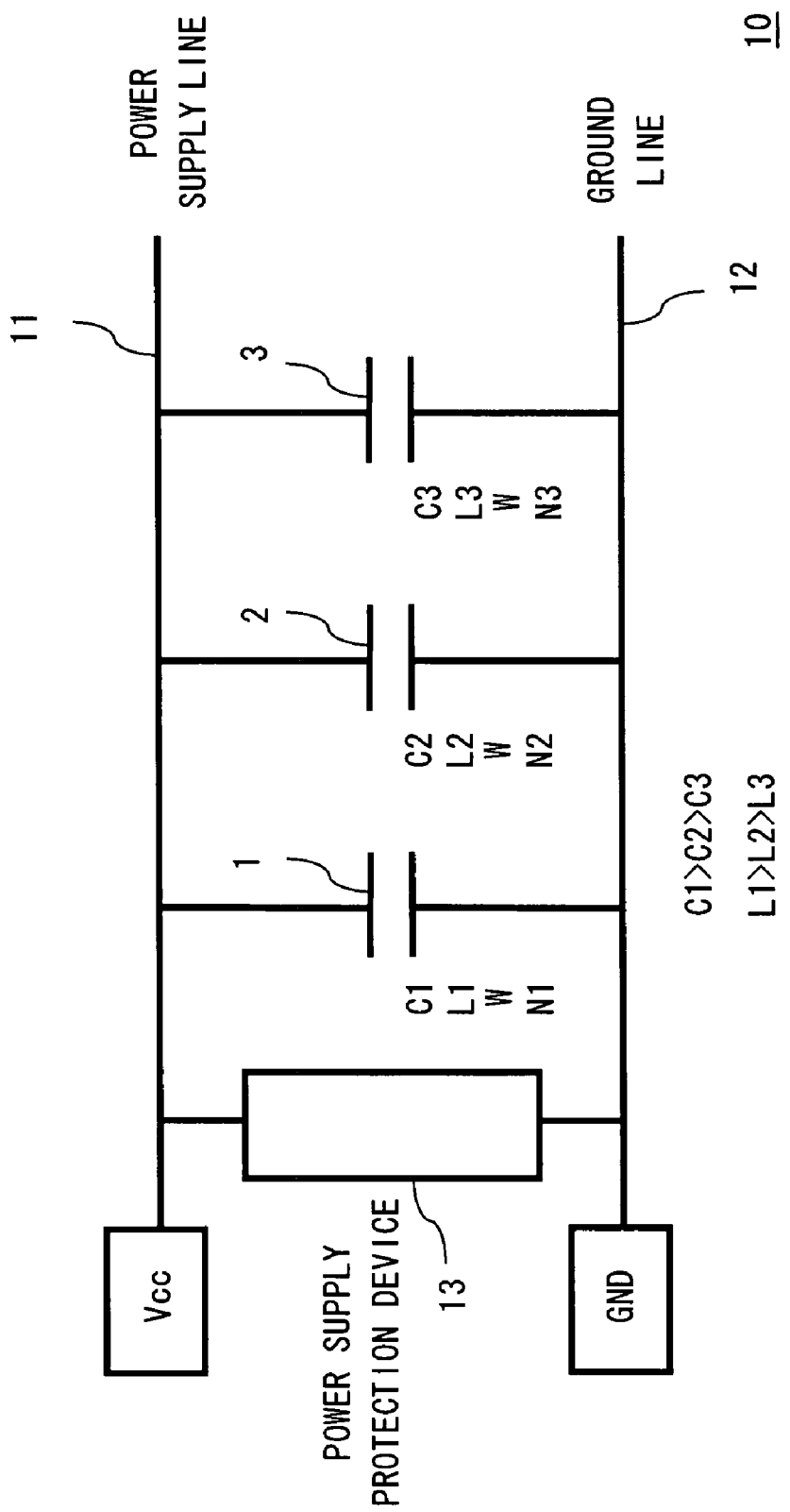
FIG. 1 shows the configuration of a semiconductor integrated circuit device according to a first embodiment.
Figure 2:
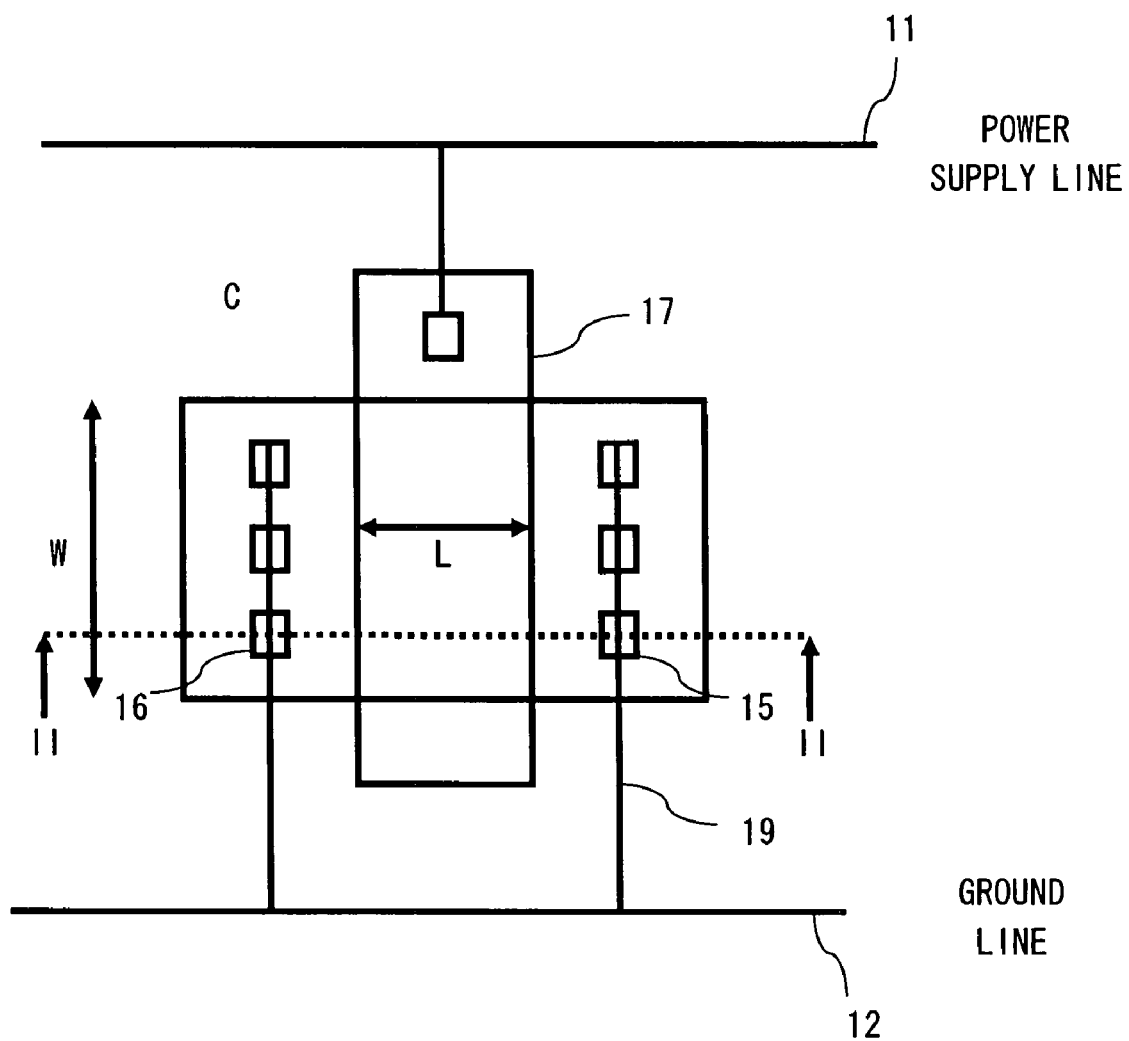
FIG. 2 shows the configuration of a MOS capacitance device mounted to the semiconductor integrated circuit device according to the first embodiment.
Figure 3:
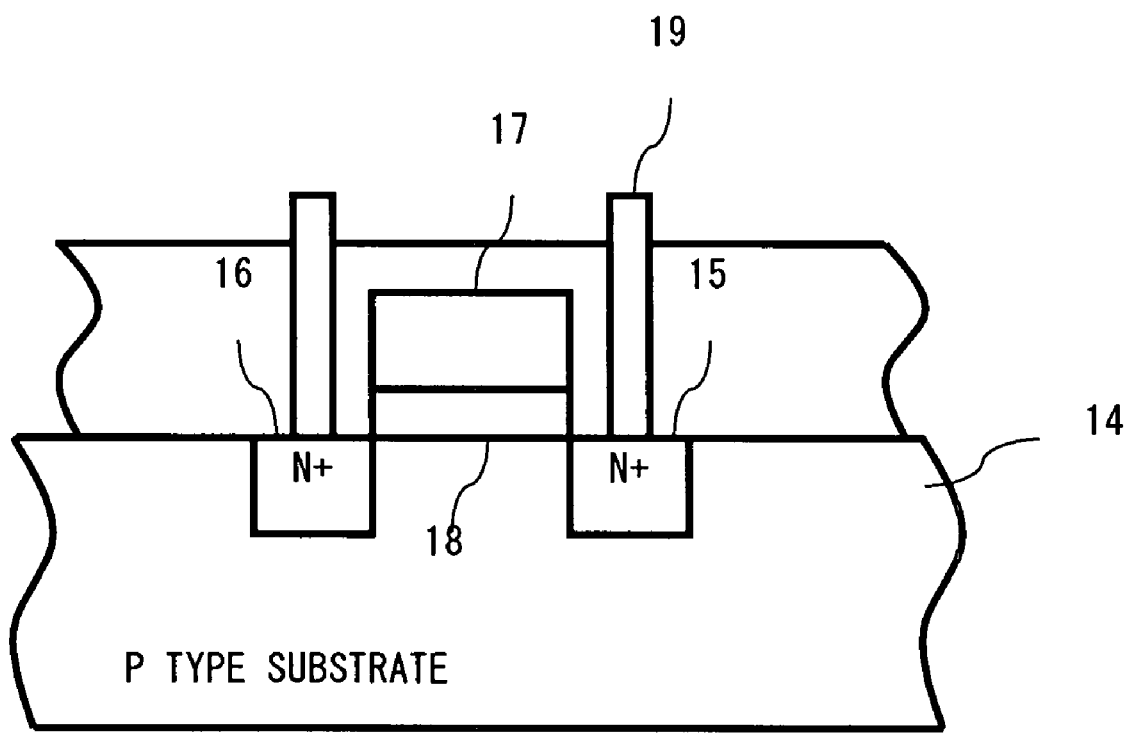
FIG. 3 is a cross-sectional diagram taken along the line II-II of FIG. 2.

A first embodiment of the present invention is explained with reference to FIGS. 1 to 3. FIG. 1 shows the circuit configuration of a semiconductor integrated circuit device 10 according to this embodiment. Moreover, FIG. 2 is a plane view of a MOS capacitance device mounted to the semiconductor integrated circuit device 10 of this embodiment. FIG. 3 is a cross-sectional diagram taken along the line II-II of FIG. 2. Note that the internal circuit is omitted in FIG. 1.

As shown in FIG. 1, the semiconductor integrated circuit device 10 of this embodiment includes a power supply terminal Vcc, a ground terminal GND, a power supply line 11, a ground line 12, a power supply protection device 13 and capacitors 1, 2 and 3. In this embodiment, the capacitors 1, 2 and 3 are all formed of N type MOS capacitance devices. Note that in this embodiment, although the example of a semiconductor integrated circuit device having 3 capacitors is explained, it is not limited to this. Moreover, the capacitors 1, 2 and 3 are made in the same way as an normal N type MOSFET.

The power supply line 11 is connected to the power supply terminal Vcc. Moreover, the ground line 12 is connected to the ground terminal GND. The power supply line 11 and the ground line 12 are formed to extend in the same direction respectively from the power supply terminal Vcc and the ground terminal GND. That is, the direction in which the power supply line 11 is extended from the power supply terminal Vcc and the direction in which the ground line 12 is extended from the ground terminal GND are the same. One electrode of the capacitors 1, 2 and 3 is respectively connected to the power supply line 11. Moreover, the other electrode of the capacitors 1, 2 and 3 is respectively connected to the ground line 12. Therefore, the plurality of capacitors 1, 2 and 3 are connected in parallel between the power supply line 11 and the ground line 12.

The capacitor 2 is disposed to the power supply terminal Vcc and the ground terminal GND side of the capacitor 3. Moreover, the capacitor 1 is disposed to the power supply terminal and the ground terminal side of the capacitor 2. Specifically, the capacitor 1 is arranged at a first distance from one of the terminals and the capacitor 2 is arranged at a second distance which is larger than the first distance from the one of the terminals. The capacitor 3 is arranged at a third distance which is larger than the second distance from the one of the terminals. Furthermore, the power supply protection device 13 is formed to the power supply terminal Vcc and the ground terminal GND side of the capacitor 1. The power supply protection device 13 is formed between the power supply line 11 and the ground line 12. The power supply protection device 13 is provided to prevent surge current from flowing into an internal circuit, control the voltage applied to the internal circuit and protect the internal circuit from ESD.

FIGS. 2 and 3 show the configuration of the MOS capacitance device according to this embodiment. Although the capacitors 1, 2 and 3 all have the configuration shown in FIGS. 2 and 3, the shapes are different as described below. Firstly, the configuration of the MOS capacitance device is explained. As shown in FIG. 2, an N+ diffusion layer 15, an N+ diffusion layer 16 and a gate electrode 17 are formed over a P type substrate 14 to form the MOS capacitance device. As shown in FIG. 3, the N+ diffusion layers 15 and 16 are disposed separately over the P type substrate 14. A gate insulating film 18 is formed over the substrate surface between the N+ diffusion layers 15 and 16. The gate electrode 17 is formed over the gate insulating film 18. Each of the N+ diffusion layers 15 and 16 is connected to plug contacts 19. The plug contacts 19 are connected to the ground line 12. This is the same as the one in which a source and a drain of a normal MOSFET are grounded. On the other hand, the gate electrode 17 is connected to the power supply line 11.

Next, the difference in the shape of each capacitor is explained. As shown in FIG. 2, width of the MOS capacitance device shall be W and length shall be L. In this document, to express the size of the MOS capacitance device, the expressions of the gate width W and the gate length L for a MOSFET are used for convenience. That is, the length L of the capacitance device is the gate length of the gate electrode 17, and the width W of the capacitance device is the width of the gate electrode 17 which overlaps with the N+ diffusion layers 15 and 16. The length L of each capacitance device is formed to be shorter as it is farther from the power supply terminal Vcc and the ground terminal GND. Therefore, the length L2 of the capacitor 2 is shorter than the length L1 of the capacitor 1. Moreover, the length L3 of the capacitor 3 is shorter than the length L2 of the capacitor 2.

Note that in this embodiment, each width of the capacitors 1, 2 and 3 is equal. Therefore, the areas (L×W) of the capacitors 1, 2 and 3 are larger by the side of the power supply terminal Vcc and the ground terminal GND. More specifically, the areas of the capacitors 1, 2 and 3 become smaller inversely proportional to the distance from the one of the terminals. That is, the area of the capacitor 1 is larger than the area of the capacitor 2, and the area of the capacitor 2 is larger than the area of the capacitor 3.

For example, the following combination can be made; the width W of the capacitors 1, 2 and 3 are made to be equal, which is 50 μm, the length L1 of the capacitor 1 is 50 to 100 um, the length of the capacitor 2 is 10 to 20 μm and the length L3 of the capacitor 3 is 1 to 5 μm. In order to have such combination, the gate width of the capacitance devices forming each capacitor may be formed to have a difference of severalfold to one order of magnitude.

Note that in FIG. 1, each capacitor is indicated by one capacitor symbol. However in reality, the capacitors 1, 2 and 3 are formed as a capacitance device group having a plurality of capacitance devices of almost the same shape. Here, the capacitor 1 is formed of a capacitance device group of N1 capacitance devices with a capacitance value C1, the capacitor 2 is formed of a capacitance device group of N2 capacitance devices with a capacitance value C2 and the capacitor C3 is formed of a capacitance device group of N3 capacitance devices with a capacitance value C3. The capacitor 1 has the configuration in which N1 capacitance devices having the capacitance value C1 and almost the same shape are connected in parallel. Moreover, the capacitor 2 has the configuration in which N2 capacitance devices having the capacitance value C2 and almost the same shape are connected in parallel. Furthermore, a capacitor 3 has the configuration in which N3 capacitance devices having the capacitance value C3 and almost the same shape are connected in parallel. The capacitors may be formed so that the total capacitance value of each capacitance device may become smaller as it is farther from the power supply terminal Vcc and the ground terminal GND. That is, the capacitors may be formed to be C1*N1>C2*N2>C3*N3.

Moreover, the numbers N1, N2 and N3 of each capacitance devices may be adjusted so that the total capacitance value of the 3 capacitance device groups (the capacitors 1, 2 and 3) may be equal. That is, it can be adjusted to be C1*N1=C2*N2=C3*N3. The length L and the width W of the capacitance device and the total capacitance value of each capacitor (the number N of the capacitance device) can be determined in consideration of the circuit size and the characteristics of generated noise. It is needless to say that capacitance device groups with 3 or more kinds of different shapes may be provided.

A MOS capacitance device is known to have gate length dependency and response to noise with high frequency as the gate length is shorter (gate area is smaller). The present invention enables to follow a plurality of noise characteristics by providing MOS capacitance devices of several shapes. Therefore, noise between power supply and ground can be effectively reduced.

Moreover, ESD robustness of a MOS capacitance device has area dependency and known to have lower ESD robustness as the area is smaller. In the present invention, the shape of the MOS capacitance device formed near the external terminal where more current flows is enlarged. Therefore, the MOS capacitance device itself is hard to be destroyed by ESD. Therefore, the present invention achieves to reduce noise and improve ESD robustness at the same time by optimizing the shape and the arrangement of the MOS capacitance device.

Note that although in the abovementioned example, the width W of the capacitance devices were made to be the same and the length L of the capacitance device is made to be smaller as it is farther from the power supply terminal Vcc and the ground terminal GND, it is not limited to this. For example, the length L of the capacitance device may made to be constant and the width W of each capacitance device may made to be smaller as it is farther from the power supply terminal Vcc and the ground terminal GND. Moreover, both of the length L and the width W of the capacitance device may made to be smaller as it is farther from the power supply terminal Vcc and the ground terminal GND. That is, the area of each capacitance device needs to be smaller as it is farther from the power supply terminal Vcc and the ground terminal GND. Therefore, the plurality of capacitors 1, 2 and 3 may be almost square or almost rectangular shape.

Second Embodiment

Figure 4:
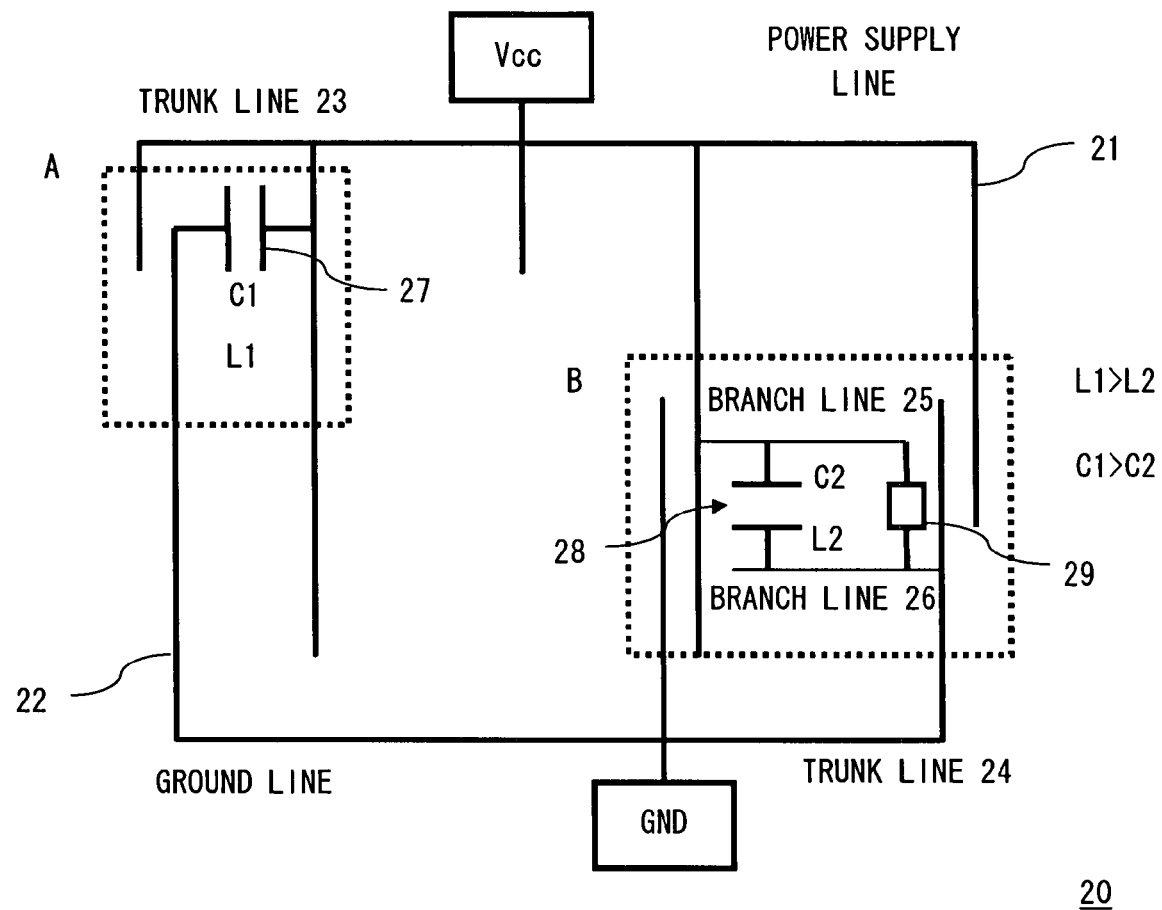
FIG. 4 shows the configuration of a semiconductor integrated circuit device according to a second embodiment.

A semiconductor integrated circuit device 20 according to a second embodiment of the present invention is explained with reference to FIG. 4. FIG. 4 shows the configuration of the semiconductor integrated circuit device 20 according to this embodiment. There are many power supply lines and ground lines in the whole LSI. The power supply line and the ground line each have a trunk line and its branch line. As shown in FIG. 4, the semiconductor integrated circuit device 20 of this embodiment includes a power supply terminal Vcc, a ground terminal GND, a power supply line 21, a ground line 22 and a functional circuit block 29. The power supply line 21 includes a trunk line 23 and a branch line 25. Moreover, the ground line 22 includes a trunk line 24 and a branch line 26. The trunk line 23 is extended from the power supply terminal Vcc. Then, the branch line 25 is extended and branches from the trunk line 23. On the other hand, the trunk line 24 is extended from the ground terminal GND. Then, the branch line 26 is extended and branches from the trunk line 24.

In this embodiment, an example is illustrated in which the power supply line 21 and the ground line 22 provide a decoupling capacitor to the place indicated as A in FIG. 4 for the trunk lines (between the trunk lines 23 and 24) and to the place indicated as B for the branch lines (between the branch lines 25 and 26). A capacitor 27 is formed between the trunk lines 23 and 24. Moreover, a capacitor 28 is formed between the branch lines 25 and 26. The capacitor 27 has a gate area larger than the capacitor 28. In this embodiment, the gate length L1 of the capacitor 27 is longer than the gate length L2 of the capacitor 28.

The distance between the branch lines 25 and 26 and the power supply terminal Vcc and the ground terminal GND is longer than the distance between the trunk lines 23 and 24 and the power supply terminal Vcc and the ground terminal GND. Moreover, as noise of many circuit blocks is superimposed near the power supply terminal Vcc and the ground terminal GND and the trunk lines 23 and 24, noise frequency often cannot be specified. However there are a lot of low frequency noises generated. Accordingly, the area of the capacitor 27 formed near the power supply terminal and the ground terminal GND is increased (increase the gate length). This enables to suppress from destroying the capacitor 27 by ESD and effectively reduce the low frequency noise.

Moreover, both or either of the branch lines connected to the power supply line and the ground line is connected to the functional circuit block 29. In this embodiment, the functional circuit block 29 is formed between the branch lines 25 and 26. Although depending on the operation, the noise generated from the functional circuit block 29 often includes high frequency component. Moreover, since the capacitor 28 between the branch lines 25 and 26 is far from the power supply terminal Vcc and the ground terminal GND, it has a small risk of ESD breakdown. Therefore, the gate length of the capacitor 28 formed between the branch lines 25 and 26 is shortened so as to effectively reduce the noise generated from the functional circuit block connected to the branch lines. Moreover, if noise-frequency can be specified, a MOS capacitance device can be formed to respond to the frequency well.

As described above, in this embodiment, by having a larger decoupling capacitor connected to the trunk line than the decoupling capacitor connected to the branch line, it is possible to achieve ESD countermeasure for the decoupling capacitors themselves and improve noise-frequency response characteristics.

Note that in FIG. 4, the capacitors 27 and 28 are expressed with one circuit symbol. However in reality, the capacitors 27 and 28 are formed as a capacitance device group formed of a plurality of MOS capacitance devices.

Moreover, many functional circuits are mounted to the actual product. Therefore, when providing a decoupling capacitor between the power supply line 21 and the ground line 22 including the branch lines supplied to a plurality of functional circuits F1, F2, F3 . . . , the decoupling capacitor can be formed according to the noise characteristics of the functional circuits F1, F2 and F3. To be more specific, a plurality of capacitance devices with a capacitance value C1 and an area L1*W1 are formed corresponding to the functional circuit F1, a plurality of capacitance devices with a capacitance value C2 and an area L2*W2 are formed corresponding to the functional circuit F2 and a plurality of capacitance devices with a capacitance value C3 and an area L3*W3 are formed corresponding to the functional circuit F3. Moreover, the decoupling capacitor provided between the trunk lines 23 and 24 will have a longer gate length and larger area than those formed between each branch lines of the power supply line and the ground line. As described above, by dispersing MOS capacitance devices having desired shapes inside a chip, it is possible to achieve both ESD countermeasure for the MOS capacitance devices themselves and reduce noise of the functional circuit block 29.

Third Embodiment

Figure 5:
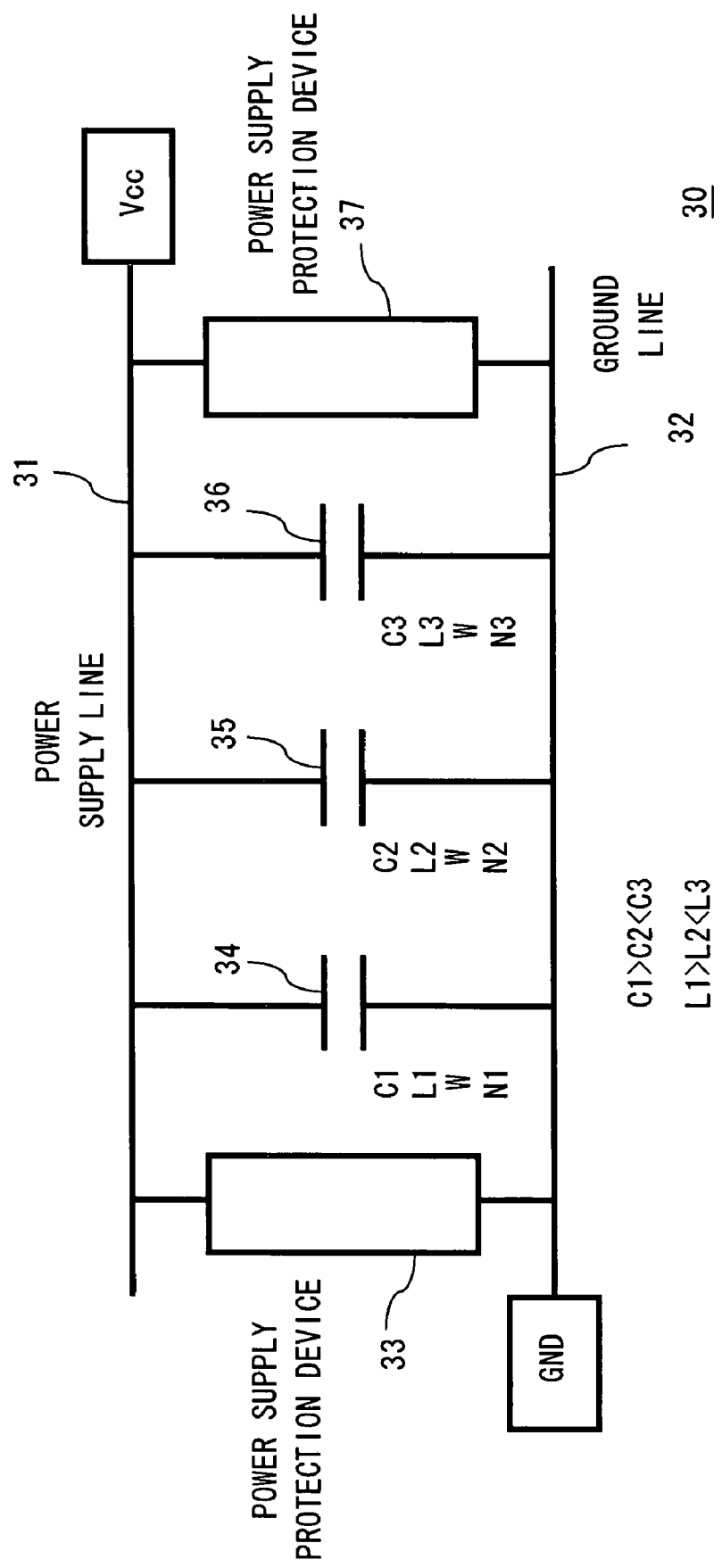
FIG. 5 shows the configuration of a semiconductor integrated circuit device according to a third embodiment.
Figure 6:
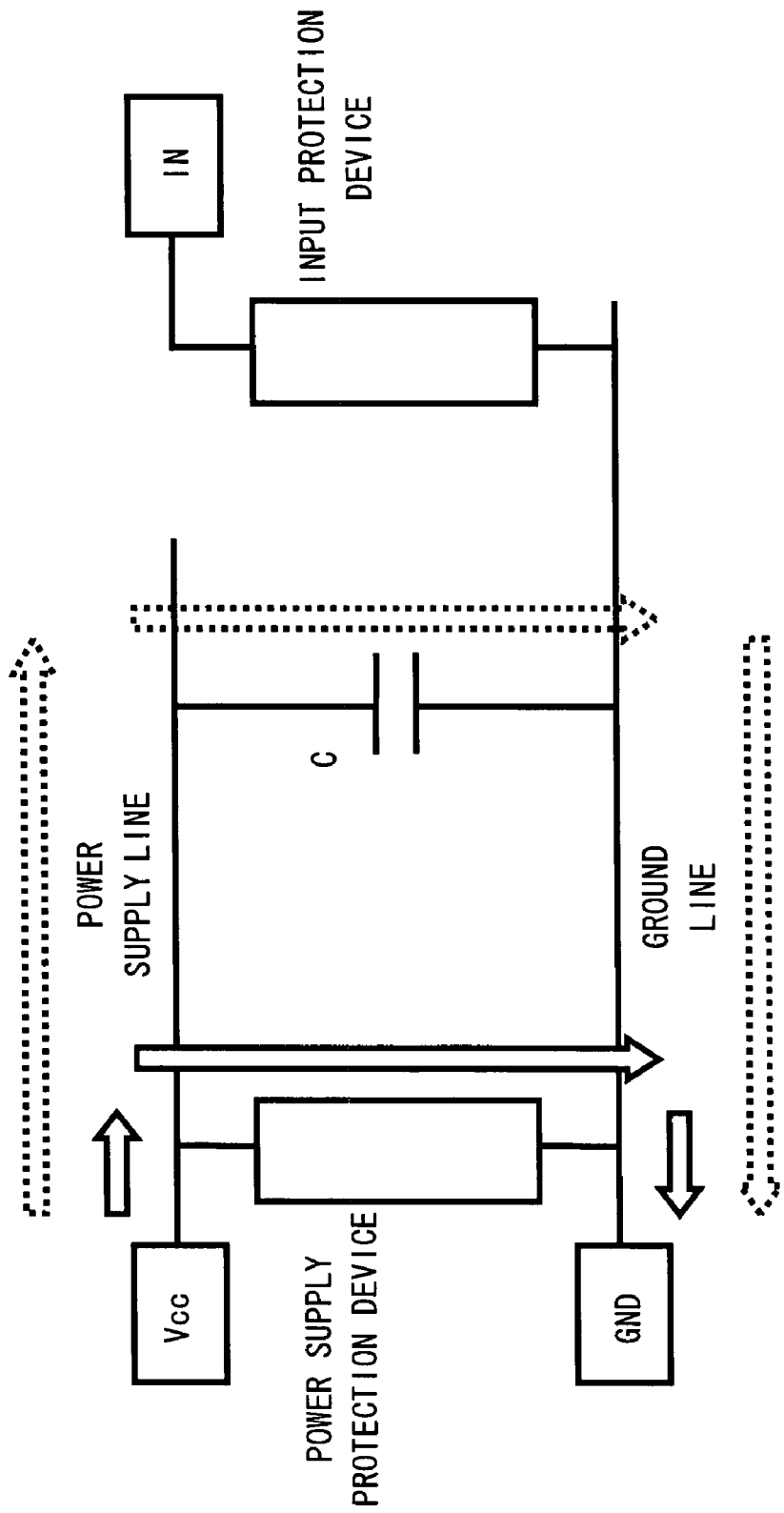
FIG. 6 shows the configuration of a conventional semiconductor integrated circuit device.

A semiconductor integrated circuit device 30 according to a third embodiment of the present invention is explained with-reference to FIG. 5. FIG. 5 shows the configuration of the semiconductor integrated circuit device 30 of this embodiment. A difference in this embodiment from the first embodiment shown in FIG. 1 is the locating position of the power supply terminal Vcc and the ground line GND.

As shown in FIG. 5, a power supply line 31 extended from the power supply terminal Vcc is formed toward the ground terminal GND side. Moreover, a ground line 32 extended from ground terminal GND is formed toward the power supply terminal Vcc side. Between the power supply line 31 and the ground line 32, a power supply protection device 33, capacitors 34, 35, and 36 and a power supply protection device 37 are provided from the ground terminal GND side to the power supply terminal Vcc side. That is, the distance from the power supply terminal Vcc to the capacitor 34 differs from the distance from the ground terminal GND to the capacitor 34. Moreover, the distance from the power supply terminal Vcc to the capacitor 36 differs from the distance from the ground terminal GND to the capacitor 36.

Also in this embodiment, the area of each capacitor is formed to be smaller as it is farther from external terminals (the power supply terminal Vcc and the ground terminal GND). In this embodiment, the power supply terminal Vcc and the ground terminal GND are formed in the opposite side. Therefore, the area of the capacitor 36 provided near the power supply terminal Vcc is larger than the area of the capacitor 35. Moreover, the area of the capacitor 34 provided near the ground terminal GND is larger than the capacitor 35.

Specifically, the length L of each capacitance device is formed to be shorter as it is farther from the power supply terminal Vcc or the ground terminal GND. Thus, the length L2 of the capacitor 35 is shorter than the length L1 of the capacitor 34. Moreover, the length L2 of the capacitor 35 is shorter than the length L3 of the capacitor 36. Note that as described above, the width W or both the width and the length of each capacitance device may be formed to be shorter as it is farther from the power supply terminal Vcc or the ground terminal GND.

In this way, if the power supply terminal Vcc and the ground terminal GND are positioned opposite when viewed from each other's wiring direction, the area of the decoupling capacitor disposed to the side near the external terminals (the power supply terminal Vcc and the ground terminal GND) is made to be larger than the decoupling capacitor disposed far from the external terminals. Thus, ESD robustness can be improved by forming a MOS capacitance device with a large area near the external terminals. Moreover, since various shaped MOS capacitance devices are formed in one chip, noise of various frequencies can be reduced.

In addition, as mentioned above, the capacitors 34, 35 and 36 may all be formed as a capacitance device group having a plurality of capacitance devices in almost the same shape. In such case, the capacitor 34 shall be formed of capacitance device group of N1 capacitance devices with a capacitance value C1, the capacitor 35 shall be formed of capacitance device group of N2 capacitance devices with a capacitance value C2 and the capacitor 36 shall be formed of capacitance device group of N3 capacitance devices with a capacitance value C3. Each capacitance device is formed to satisfy $C1>C2<C3$. Moreover, the capacitance devices may be formed to satisfy so that the total capacitance value of each capacitance device group satisfies the relationship of $C1*N1>C2*N2<C3*N3$. Otherwise, the numbers N1, N2 and N3 of each capacitance may be adjusted so that the total capacitance value of the 3 capacitance device groups (the capacitors 34, 35 and 36) may be equal. Thus, they may be adjusted to be $C1*N1=C2*N2=C3*N3$.

As explained above, it is possible to achieve noise reduction effect and eliminate the risk of ESD breakdown for capacitance device itself by optimizing the shape of the decoupling capacitor and the locating position inside a chip.

Note that in the above explanation, an example is explained in which the plurality of capacitors are formed of MOS capacitance devices, however it is not limited to this. For example, it is also possible to use a MIS capacitance device, a MIM capacitance device, etc. as a capacitor.

It is apparent that the present invention is not limited to the above embodiments, but may be modified and changed without departing from the scope and spirit of the invention.

What is claimed is:

1. A semiconductor integrated circuit device comprising:
    a power supply line connected to a power supply terminal;
    a ground line connected to a ground terminal; and
    a plurality of capacitors connected in parallel between the power supply line and the ground line,
    wherein the plurality of capacitors include a first capacitor arranged at a first distance from one of the terminals and a second capacitor arranged at a second distance which is larger than the first distance from the one of the terminals, and
    the first capacitor has a larger area than the second capacitor, wherein the plurality of capacitors have function of a decoupling capacitor and a static electricity protection function.

2. The semiconductor integrated circuit device according to claim 1,
    wherein areas of the plurality of capacitors become smaller as the distance from the one of the teiminals becomes larger.

3. The semiconductor integrated circuit device according to claim 1, wherein a value of the first capacitor is larger than that of the second capacitor.

4. The semiconductor integrated circuit device according to claim 1, wherein at least either a length or a width of the first capacitor is larger than that of the second capacitor.

5. The semiconductor integrated circuit device according to claim 1, wherein the first capacitor is formed of N1 capacitance devices having a capacitance value of C1 each and in almost same shape,
    the second capacitor is formed of N2 capacitance devices having a capacitance value of C2 each and in almost same shape, and
    the semiconductor integrated circuit device satisfies a relationship of $C1*N1 \geq C2*N2$.

6. The semiconductor integrated circuit device according to claim 5, wherein the capacitance value of C1 is larger than the capacitance value of C2.

7. The semiconductor integrated circuit device according to claim 1, wherein the first capacitor is formed of N1 capacitance devices,
    the second capacitor is formed of N2 capacitance devices, and
    a number of N1 is larger than a number of N2.

8. The semiconductor integrated circuit device according to claim 1, wherein the area of each of the capacitors is an area of electrodes of the respective capacitor.

9. The semiconductor integrated circuit device according to claim 1, wherein areas of the plurality of capacitors are inversely proportional to the distance from the one of the terminals.

10. The semiconductor integrated circuit device according to claim 9, wherein at least either lengths or widths of the plurality of capacitors are inversely proportional to the distance from one of the terminals.

11. The semiconductor integrated circuit device according to claim 9, wherein the plurality of capacitors are each formed of a plurality of capacitance devices in almost same shape, and each of total capacitance values of the plurality of capacitors are made to be smaller as they are farther from the power supply terminal and the ground terminal or made to be equal.

12. A semiconductor integrated circuit device comprising:
a power supply line connected to a power supply terminal;
a ground line connected to a ground terminal; and
a plurality of capacitors connected in parallel between the power supply line and the ground line,
wherein the plurality of capacitors include a first capacitor arranged at a first distance from one of the terminals and a second capacitor arranged at a second distance which is larger than the first distance from the one of the terminals, and
the first capacitor has a larger area than the second capacitor, wherein areas of the plurality of capacitors become smaller as the distance from the one of the terminals becomes larger,
wherein the power supply line and the ground line each includes a trunk line and a branch line,
the first capacitor has one electrode connected to the trunk line of the power supply line and another electrode connected to the trunk line of the ground line, and
the second capacitor has at least one electrode connected to the branch line of the power supply line or the branch line of the ground line.

13. The semiconductor integrated circuit device according to claim 1, further comprising a functional circuit block supplied with a potential via the power supply line and the ground line,
wherein the first capacitor is provided near the power supply terminal and/or the ground terminal, and
the second capacitor is provided near the functional circuit block.

14. A semiconductor integrated circuit device comprising:
a power supply line connected to a power supply terminal;
a ground line connected to a ground terminal;
a plurality of capacitors connected in parallel between the power supply line and the ground line,
wherein the plurality of capacitors include a first capacitor arranged at a first distance from one of the terminals and a second capacitor arranged at a second distance which is larger than the first distance from the one of the terminals,
the first capacitor has a larger area than the second capacitor, wherein areas of the plurality of capacitors become smaller as the distance from the one of the terminals becomes larger;
a functional circuit block supplied with a potential via the power supply line and the ground line,
wherein the first capacitor is provided near the power supply terminal and/or the ground terminal, and the second capacitor is provided near the functional circuit block; and
a plurality of functional circuit blocks supplied with a potential via the power supply line and the ground line,
wherein the plurality of capacitors are formed to correspond to the plurality of functional circuit blocks.

15. The semiconductor integrated circuit device according to claim 1, wherein the plurality of capacitors include a MOS capacitance device, a MIS capacitance device or a MIM capacitance device.

16. The semiconductor integrated circuit device according to claim 1, wherein electrodes of the plurality of capacitors are almost square shape.

17. The semiconductor integrated circuit device according to claim 1, wherein electrodes of the plurality of capacitors are almost rectangle shape.

18. A semiconductor apparatus, comprising:
a semiconductor integrated circuit device comprising:
a power supply line connected to a power supply terminal;
a ground line connected to a ground terminal; and
a plurality of capacitors connected in parallel between the power supply line and the ground line,
wherein the plurality of capacitors include a first capacitor arranged at a first distance from one of the terminals and a second capacitor arranged at a second distance which is larger than the first distance from the one of the terminals, and
the first capacitor has a larger area than the second capacitor, wherein areas of the plurality of capacitors become smaller as the distance from the one of the terminals becomes larger; and
a power supply source provided outside of the semiconductor integrated circuit device,
wherein the power supply terminal receives a power supply input from the power supply source.

* * * * *